(12) United States Patent
Ohtani et al.

(10) Patent No.: US 8,248,551 B2
(45) Date of Patent: Aug. 21, 2012

(54) SEMICONDUCTOR DEVICE INCLUDING CAPACITOR LINE PARALLEL TO SOURCE LINE

(75) Inventors: Hisashi Ohtani, Atsugi (JP); Yasushi Ogata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/111,344

(22) Filed: May 19, 2011

(65) Prior Publication Data

US 2011/0215327 A1  Sep. 8, 2011

Related U.S. Application Data

(60) Continuation of application No. 12/358,617, filed on Jan. 23, 2009, now Pat. No. 7,948,571, and a continuation of application No. 10/307,421, filed on Dec. 2, 2002, now Pat. No. 7,483,089, and a division of application No. 09/046,686, filed on Mar. 24, 1998, now Pat. No. 6,490,014.

(30) Foreign Application Priority Data

Mar. 28, 1997 (JP) ................................. 09-095069

(51) Int. Cl.
*G02F 1/136* (2006.01)
*G02F 1/1343* (2006.01)
*G02F 1/1333* (2006.01)
*H01L 21/02* (2006.01)
*H01L 27/14* (2006.01)

(52) U.S. Cl. .............. 349/44; 349/38; 349/39; 349/138; 349/139; 257/346; 257/72

(58) Field of Classification Search ................... 349/44, 349/38, 39, 138, 139; 257/346, 72
See application file for complete search history.

(56) References Cited

U.S. PATENT DOCUMENTS

| | | | |
|---|---|---|---|
| 4,623,908 A | 11/1986 | Oshima et al. | |
| 4,759,610 A | 7/1988 | Yanagisawa | |
| 5,159,477 A | 10/1992 | Shimada et al. | |
| 5,283,566 A | 2/1994 | Mimura et al. | |
| 5,345,324 A | 9/1994 | Koseki et al. | |

(Continued)

FOREIGN PATENT DOCUMENTS

JP  04-366924  12/1992

(Continued)

*Primary Examiner* — Mike Qi

(74) *Attorney, Agent, or Firm* — Eric J. Robinson; Robinson Intellectual Property Law Office, P.C.

(57) ABSTRACT

A first insulating thin film having a large dielectric constant such as a silicon nitride film is formed so as to cover a source line and a metal wiring that is in the same layer as the source line. A second insulating film that is high in flatness is formed on the first insulating film. An opening is formed in the second insulating film by etching the second insulating film, to selectively expose the first insulating film. A conductive film to serve as a light-interruptive film is formed on the second insulating film and in the opening, whereby an auxiliary capacitor of the pixel is formed between the conductive film and the metal wiring with first the insulating film serving as a dielectric. The effective aperture ratio can be increased by forming the auxiliary capacitor in a selected region where the influences of alignment disorder of liquid crystal molecules, i.e., disclination, are large.

19 Claims, 10 Drawing Sheets

U.S. PATENT DOCUMENTS

| | | | |
|---|---|---|---|
| 5,398,127 A | 3/1995 | Kubota et al. | |
| 5,459,596 A | 10/1995 | Ueda et al. | |
| 5,473,455 A | 12/1995 | Koike et al. | |
| 5,483,366 A | 1/1996 | Atherton | |
| 5,499,123 A | 3/1996 | Mikoshiba | |
| 5,510,916 A | 4/1996 | Takahashi | |
| 5,585,951 A | 12/1996 | Noda et al. | |
| 5,650,636 A | 7/1997 | Takemura et al. | |
| 5,652,634 A | 7/1997 | Hirata et al. | |
| 5,708,485 A | 1/1998 | Sato et al. | |
| 5,712,495 A | 1/1998 | Suzawa | |
| 5,717,224 A | 2/1998 | Zhang | |
| 5,721,601 A | 2/1998 | Yamaji et al. | |
| 5,726,727 A | 3/1998 | Shibahara et al. | |
| 5,737,049 A | 4/1998 | Shin et al. | |
| 5,745,195 A | 4/1998 | Zhang | |
| 5,747,830 A | 5/1998 | Okita | |
| 5,777,701 A | 7/1998 | Zhang | |
| 5,781,254 A | 7/1998 | Kim et al. | |
| 5,781,260 A | 7/1998 | Miyazawa | |
| 5,781,262 A | 7/1998 | Suzuki et al. | |
| 5,784,133 A | 7/1998 | Kim et al. | |
| 5,814,378 A | 9/1998 | Onishi et al. | |
| 5,818,552 A | 10/1998 | Sato | |
| 5,831,692 A | 11/1998 | Lee | |
| 5,835,171 A | 11/1998 | Hanazawa et al. | |
| 5,852,488 A | 12/1998 | Takemura | |
| 5,859,677 A | 1/1999 | Watanabe et al. | |
| 5,886,365 A | 3/1999 | Kouchi et al. | |
| 5,899,548 A | 5/1999 | Ishiguro | |
| 5,905,548 A | 5/1999 | Shimada | |
| 5,917,563 A | 6/1999 | Matsushima | |
| 5,920,362 A | 7/1999 | Lee | |
| 5,943,106 A | 8/1999 | Sukenori et al. | |
| 5,953,085 A | 9/1999 | Shimada | |
| 5,966,193 A | 10/1999 | Zhang et al. | |
| 5,978,056 A | 11/1999 | Shintani et al. | |
| 5,982,460 A | 11/1999 | Zhang et al. | |
| 5,986,723 A | 11/1999 | Nakamura et al. | |
| 6,005,648 A | 12/1999 | Zhang et al. | |
| 6,011,604 A | 1/2000 | Miyazawa | |
| 6,023,074 A | 2/2000 | Zhang | |
| 6,088,070 A | 7/2000 | Ohtani et al. | |
| 6,097,454 A | 8/2000 | Zhang et al. | |
| 6,104,461 A | 8/2000 | Zhang et al. | |
| 6,115,088 A | 9/2000 | Zhang et al. | |
| 6,219,118 B1 | 4/2001 | Zhang | |
| 6,249,327 B1 | 6/2001 | Murade et al. | |
| 6,259,117 B1 | 7/2001 | Takemura et al. | |
| 6,275,273 B1 * | 8/2001 | Inoue | 349/40 |
| 6,297,518 B1 | 10/2001 | Zhang | |
| 6,421,101 B1 | 7/2002 | Zhang et al. | |
| 6,452,654 B2 | 9/2002 | Kubo et al. | |
| 6,495,858 B1 | 12/2002 | Zhang | |
| 6,583,472 B1 | 6/2003 | Shibata et al. | |
| 6,618,033 B2 * | 9/2003 | Takafuji | 345/96 |
| 6,724,443 B1 * | 4/2004 | Sano et al. | 349/39 |
| 6,762,815 B2 * | 7/2004 | Lee | 349/141 |
| 6,885,027 B2 | 4/2005 | Takemura et al. | |
| 7,023,502 B2 | 4/2006 | Zhang et al. | |
| 7,046,313 B2 | 5/2006 | Zhang et al. | |
| 7,098,086 B2 | 8/2006 | Shibata et al. | |
| 7,110,059 B2 | 9/2006 | Zhang | |
| 7,148,506 B2 | 12/2006 | Zhang | |
| 7,190,420 B2 | 3/2007 | Zhang | |
| 7,199,853 B2 * | 4/2007 | Koide | 349/147 |
| 7,459,724 B2 | 12/2008 | Zhang | |
| 7,501,685 B2 | 3/2009 | Shibata et al. | |
| 7,646,022 B2 | 1/2010 | Zhang et al. | |
| 7,683,978 B2 | 3/2010 | Zhang | |
| 7,863,618 B2 | 1/2011 | Zhang et al. | |
| 7,948,571 B2 * | 5/2011 | Ohtani et al. | 349/44 |
| 7,952,094 B2 * | 5/2011 | Yamasaki | 257/59 |
| 7,982,267 B2 | 7/2011 | Shibata et al. | |
| 2011/0114964 A1 | 5/2011 | Shibata et al. | |
| 2011/0163315 A1 | 7/2011 | Zhang et al. | |

FOREIGN PATENT DOCUMENTS

| | | |
|---|---|---|
| JP | 05-044195 B | 7/1993 |
| JP | 06-148684 | 5/1994 |
| JP | 07-128685 | 5/1995 |
| JP | 07-128685 A | 5/1995 |
| JP | 08-334787 | 12/1996 |
| JP | 09-026603 | 1/1997 |
| JP | 09185084 A * | 7/1997 |
| JP | 10-010580 | 1/1998 |

* cited by examiner

SEMICONDUCTOR DEVICE INCLUDING CAPACITOR LINE PARALLEL TO SOURCE LINE

BACKGROUND OF THE INVENTION

1. Field of the Invention

The present invention relates to the circuit configuration and layout of a pixel area of an active matrix display device in which thin-film transistors are used and source lines formed above gate lines. In particular, the invention relates to the structure of an auxiliary capacitor.

2. Description of the Related Art

In recent years, techniques of forming thin-film transistors (TFTs) on an inexpensive glass substrate have been made rapid progress. This is because of increased demand for the active matrix liquid crystal display device.

In the active matrix liquid crystal display device, thin-film transistors are provided for respective ones of hundreds of thousands to millions of pixels that are arranged in matrix form and the charge entrance and exit to each pixel is controlled by the switching function of the thin-film transistor.

A liquid crystal is interposed between each pixel electrode and an opposed electrode, to form a kind of capacitor. Therefore, image display is realized by controlling the quantity of light passing through the liquid crystal panel by varying the electro-optical characteristic of the liquid crystal by controlling the entrance and exit of change to and from this capacitor with the thin-film transistor.

The capacitor having the above structure has a problem that since the voltage held by the capacitor gradually decreases due to current leakage, it changes the electro-optical characteristic of the liquid crystal and deteriorates the contrast of image display.

A common measure to solve the above problem is a configuration in which an additional capacitor called an auxiliary capacitor is provided in parallel with the capacitor including the liquid crystal and charge equivalent to charge that is lost due leakage etc. is supplied to the capacitor including the liquid crystal.

FIG. 1 is a circuit diagram of a conventional active matrix liquid crystal display device. The active matrix display circuit is generally divided into three parts: a gate driver circuit 2 for driving gate lines (i.e., gate lines, scanning lines) 4, a data driver circuit 1 for driving source lines (i.e., data lines, source lines or signal lines) 5, and an active matrix circuit 3 that is provided with pixels. The data driver circuit 1 and the gate driver circuit 2 are generically called a peripheral circuit.

In the active matrix circuit 3, a number of gate lines 4 and source lines 5 are provided so as to cross each other and pixel electrodes 7 are provided at the respective intersecting points. A switching element (thin-film transistor) 6 is provided to control charge that enters or exits from each pixel electrode 7. Selection is made between the top-gate thin-film transistor (the gate electrode is formed above the active layer) and the bottom-gate thin-film transistor (the active layer is formed above the gate electrode) in accordance with the necessary circuit structure, the manufacturing process, the required characteristics, and other factors. Further, as described above, to prevent a variation in pixel voltage due to leak current, an auxiliary capacitor 8 is provided in parallel with each pixel capacitor.

On the other hand, the conductivity of the thin-film transistor is varied by illumination with light. To prevent this phenomenon, it is necessary to cover each thin-film transistor with a light-interruptive coating (black matrix). The light-interruptive coating is formed so as to also cover the portions between the pixels to prevent color or brightness contamination between the pixels and a display failure due to a disordered electric field at pixel boundaries.

So, the light-interruptive coating assumes a matrix shape and hence is called a black matrix (BM). At first, in favor of advantages in a manufacturing process, the black matrix was provided over the substrate (opposed substrate) that opposes the substrate on which the active matrix circuit is formed. However, recently, because of the need for increasing the area of each pixel (aperture ratio), it is proposed to provide the black matrix over the substrate on which the active matrix circuit is formed.

SUMMARY OF THE INVENTION

Various proposals haven made of the structure of the auxiliary capacitor. However, it is difficult to obtain a large capacitance while maintaining the area of the open portion (light-transmissive portion) of each pixel.

The present invention has been made in view of the above circumstances in the art, and an object of the invention is therefore to provide a structure of an auxiliary capacitor which can provide a large capacitance while maintaining the area of the open portion (light-transmissive portion) of each pixel.

According to one aspect of the invention there is provided an active matrix liquid crystal display device comprising a thin-film transistor having a source region to which a pixel electrode is electrically connected; a drain electrode connected to a drain region of the thin-film transistor and formed in the same layer as a source line, the drain electrode having a pattern that covers 50% or more of an active layer of the thin-film transistor; and an auxiliary capacitor formed by using the drain electrode.

With the above configuration, the aperture ratio of the pixel can be increased because the auxiliary capacitor is formed above the thin-film transistor.

Another aspect of the invention attains the above object by forming a conductive light-interruptive film over the active-matrix-side substrate, keeping it at a constant potential, and using it as one electrode of the auxiliary capacitor. Since originally the light-interruptive film does not transmit light, the aperture ratio does not decrease even if it is used as one electrode of the auxiliary capacitor.

The active matrix liquid crystal display device of the invention comprises:

(1) a thin-film transistor;

(2) a gate line and a source line formed above the gate line;

(3) a conductive film serving as a light-interruptive film and kept at a constant potential;

(4) a metal wiring connected to a drain region of the thin-film transistor and made of the same layer as the source line; and (5) an interlayer insulating film formed between the source line and the conductive film, and comprising at least two insulating layers.

In the invention, the thin-film transistor may be of either the top gate type or the bottom gate type as long as the above conditions are satisfied. This is, since the main improvements of the invention relate to the structure above the source line, the structure below the source line (i.e., the positional relationship between the gate line and the active layer) is irrelevant. Also, the interlayer insulating layer may consist of three or more layers.

According to another aspect of the invention, in the above configuration, an auxiliary capacitor having the metal wiring and the conductive film (light-interruptive film) as electrodes and at least the lower insulating layer of the interlayer insulating film as a dielectric is formed in a region where the upper insulating layer of the interlayer insulating film is removed by etching. The dielectric may consist of two or more insulating layers.

According to a further aspect of the invention, in the above configuration, the conductive film (light-interruptive film) overlaps with the metal wiring and has a portion that is in contact with the lower insulating layer.

In the two aspects of the invention just mentioned above, it is effective to employ, as the main component of the lower insulating layer, silicon nitride that is produced stably in semiconductor processes and has a large relative dielectric constant. In this case, the dielectric of the auxiliary capacitor may be composed of only a silicon nitride layer or may have a multi-layer structure of a silicon nitride film and some other coating (for instance, a silicon oxide film).

In this case, the dielectric is made thinner and the use of silicon nitride having a large dielectric constant realizes a large capacitance. In the invention, the thickness of the silicon nitride layer is set at 1,000 Å or less, preferably 500 Å or less.

In this configuration, since the silicon nitride film covers the active matrix circuit from above the source lines, the barrier function of silicon nitride resulting from its high moisture resistance, high resistance to ions, etc. can be utilized effectively.

In the invention, it is effective to form the upper insulating layer by using an organic resin, which is easy to be planarized (for instance, polyimide, polyamide, polyimideamide, epoxy, or acrylic). In this case, since the organic resin is insufficient in barrier function (the moisture resistance, the resistance to ions, etc. are low), it is desirable that the lower insulating layer be made of a material exhibiting a superior barrier function such as silicon nitride, aluminum oxide, or aluminum nitride.

In the invention, it is effective to provide the metal wiring in a region of each pixel where disclination (alignment disorder of liquid crystal molecules due to irregularity or a lateral electric field) is prone to occur. Among various kinds of disclination, disclination due to dust or the like can be eliminated by cleaning of a manufacturing process. However, disclination caused by irregularity in the device structure (for instance, irregularity in the vicinity of a pixel electrode contact) or a lateral electric field cannot be eliminated thoroughly. It is not proper to use, for display, a pixel region where disclination occurs. Conventionally, such a region is covered with a light-interruptive film so as not to serve for display. In contrast, in the invention, the auxiliary capacitor can be provided in such a region, whereby the available area of each pixel can be utilized efficiently.

DETAILED DESCRIPTION OF THE PREFERRED EMBODIMENTS

Embodiment 1

Figure 1:
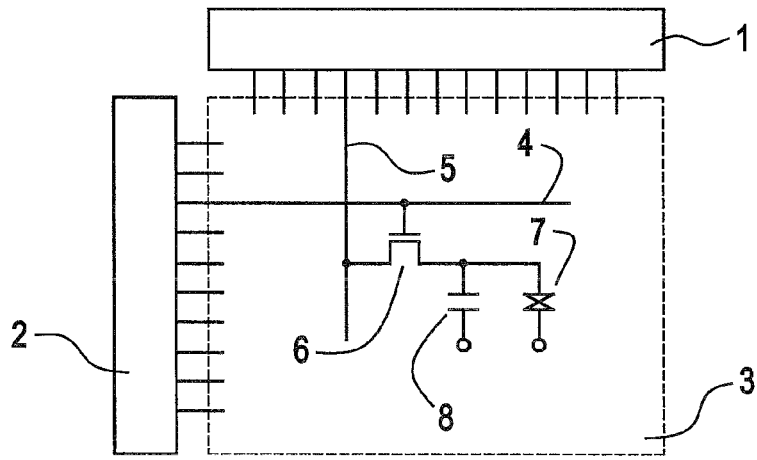
FIG. 1 is a circuit diagram of a common active matrix circuit.

FIGS. 2A-2B and FIGS. 3A-3E are top views and sectional views, respectively, showing a manufacturing process according to this embodiment. The reference numerals used in FIGS. 2A-2B and FIGS. 3A-3E correspond to each other. Numerical values of the film thickness etc. used in the following embodiments are just examples and are not necessarily optimum ones, and a party to practice the invention is completely allowed to change those values when necessary.

First, a 500-Å-thick amorphous silicon film is formed over a glass substrate 11 by plasma CVD or low-pressure CVD. It is preferable to form a 3,000-Å-thick silicon oxide film as an underlayer film on the glass substrate 11 by sputtering or plasma CVD. The underlayer film may be omitted in a case of using a quartz glass substrate.

Then, an active layer 12 of a thin-film transistor is obtained by converting the amorphous silicon film into a crystalline silicon film by a known annealing technique such as heating or laser light illumination and etching the crystalline silicon film.

Then, a 1,000-Å-thick silicon oxide film 13 as a gate insulating film is formed by plasma CVD, low-pressure CVD, or sputtering. A gate line (gate electrode) 14 is then obtained by forming and a 5,000-Å-thick polysilicon film containing phosphorus by low-pressure CVD and etching it (see FIG. 3A).

Subsequently, a source 15 and a drain 16 are formed by implanting, into the active layer 12, ions of phosphorus that is an impurity for imparting n-type conductivity at a dose of $5 \times 10^{14}$ to $5 \times 10^{15}$ atoms/cm$^2$. The source 15 and the drain 16 are given n-type conductivity. After the implantation of impurity ions, the impurity-ion-implanted regions are activated by performing a heat treatment or illumination with laser light or strong light.

Then, after a 5,000-Å-thick silicon oxide interlayer insulating film 17 is formed, contact holes reaching the source 15 and the drain 16 are formed by etching both the interlayer insulating film 17 and the gate insulating film 13. Then, a source line 18 and a metal wiring (auxiliary capacitor electrode) 19 are formed by a known metal wiring forming technique (see FIG. 3B).

Figure 2A:
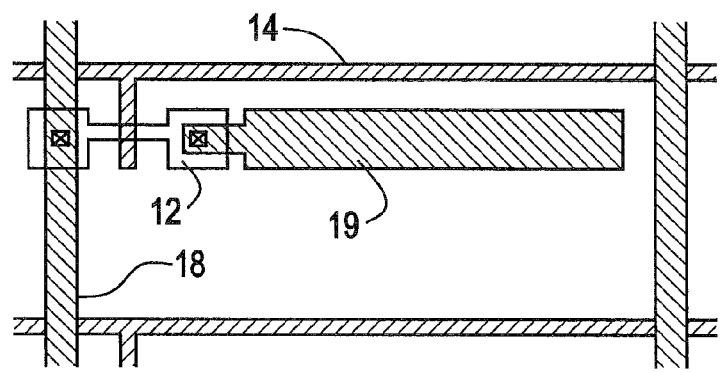
FIGS. 2A and 2B are top views showing a manufacturing process of an active matrix circuit according to a first embodiment of the present invention.

FIG. 2A is a top view showing a circuit that has been formed by the above steps.

Thereafter, a silicon nitride film 20 is formed at a thickness of 250-1,000 Å (in this embodiment, 500 Å) by a plasma CVD method that uses silane and ammonia, silane and $N_2O$, or silane, ammonia, and $N_2O$. Alternatively, the silicon nitride film 20 may be formed by using dichlorosilane and ammonia. As a further alternative, it may be formed by low-pressure CVD, photo CVD, or other proper methods.

Subsequently, a polyimide layer 21 is formed by spin coating at a thickness of at least 8,000 Å, preferably 1.5 µm. The surface of the polyimide layer 21 is planarized. An interlayer insulating film consisting of the silicon nitride layer 20 and the polyimide layer 21 is thus formed. Then, an opening 22 for an auxiliary capacitor is formed by etching the polyimide layer 21 (see FIG. 3C).

Depending on the etchant used, the silicon nitride layer 20 may also be etched in the step of etching the polyimide layer. 21. Therefore, to protect the silicon nitride film 20, a silicon oxide film having a thickness of 50-500 Å, for instance, 200 ÅA, may be formed between the silicon nitride layer 20 and the polyimide layer 21.

Then, a 1,000-Å-thick titanium film is formed by sputtering. It goes without saying that some other metal film such as a chromium film or an aluminum film may be formed, and that other proper film forming methods may be used. A black matrix 23 is formed by etching the titanium film so as to cover the opening 22 for an auxiliary capacitor (see FIG. 3D).

Figure 2B:
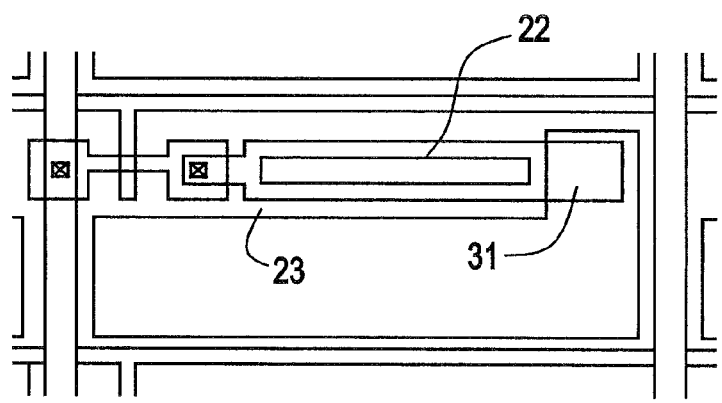
Figure 3A:
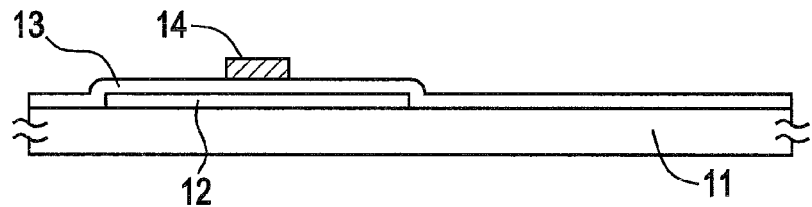
FIGS. 3A-3E are sectional views showing the manufacturing process of an active matrix circuit according to the first embodiment.
Figure 3B:
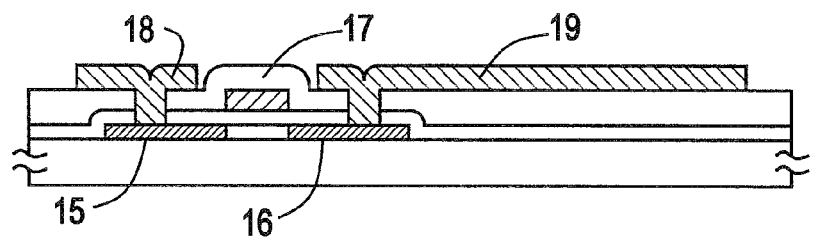
Figure 3C:
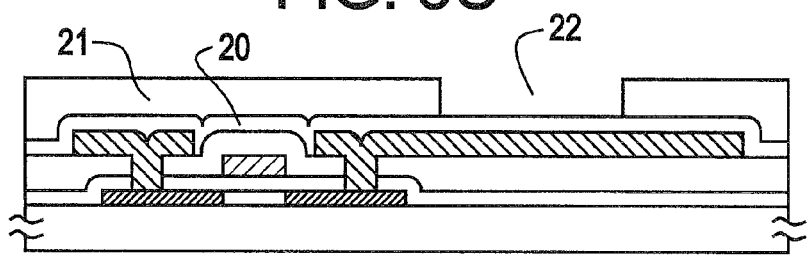
Figure 3D:
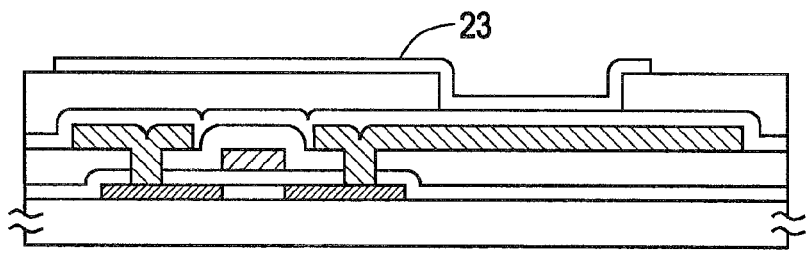
Figure 3E:
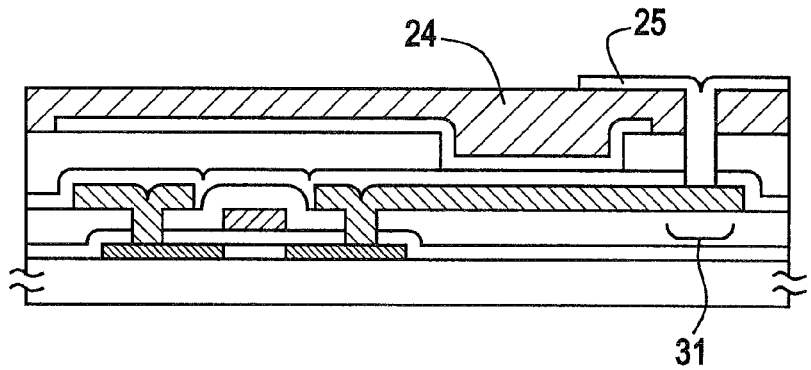

FIG. 2B is a top view showing the opening 22 for an auxiliary capacitor and the black matrix 23 that have been formed by the above steps. An auxiliary capacitor is formed in the region where the opening 22 and the black matrix 23 overlap each other. A contact hole for a pixel electrode will be formed later in a contact region 31 where the metal wiring 19 and the black matrix 23 do not overlap.

Then, after a 5,000-Å-thick polyimide film 24 is formed as an interlayer insulating film, a contact hole reaching the metal electrode 19 is formed by etching the polyimide films 21 and 24 in the contact region 31. A pixel electrode 25 is then formed by forming a 1,000-Å-thick ITO (indium tin oxide) film by sputtering and etching it (see FIG. 3E).

An active matrix circuit is thus completed. An insulating film made of polyimide, like the one used in this embodiment, can easily be planarized and hence is very advantageous. In this embodiment, the auxiliary capacitor is formed in the region 22 where the black matrix 23 and the metal wiring 19 are in close proximity to each other. The silicon nitride layer 17 serves as a dielectric.

Embodiment 2

Figure 4A:
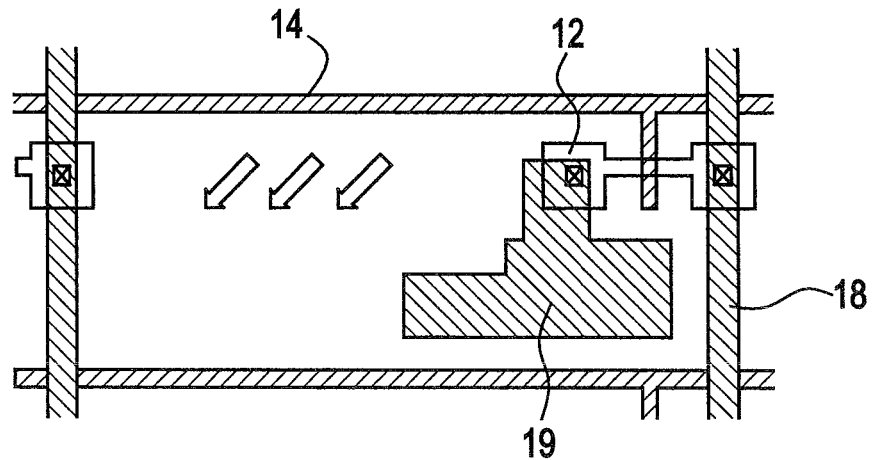
FIGS. 4A and 4B are top views showing a manufacturing process of an active matrix circuit according to a second embodiment of the invention.
Figure 4B:
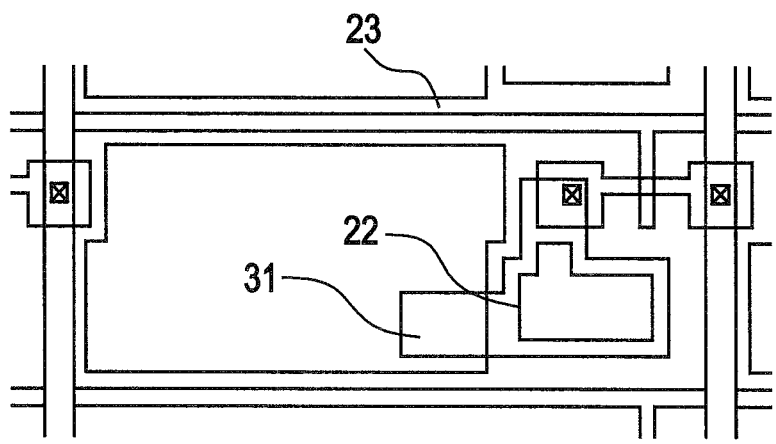

FIGS. 4A and 4B are top views showing a manufacturing processing according to this embodiment. The manufacturing process itself of this embodiment is almost the same as that of the first embodiment. The reference numerals commonly used in the first and second embodiments represent the same or equivalent parts. This embodiment is different from the first embodiment in circuit layout; that is, each pixel is formed efficiently (i.e., the effective aperture ratio is increased) by forming the auxiliary capacitor in a region where disclination is prone to occur.

Figure 5:
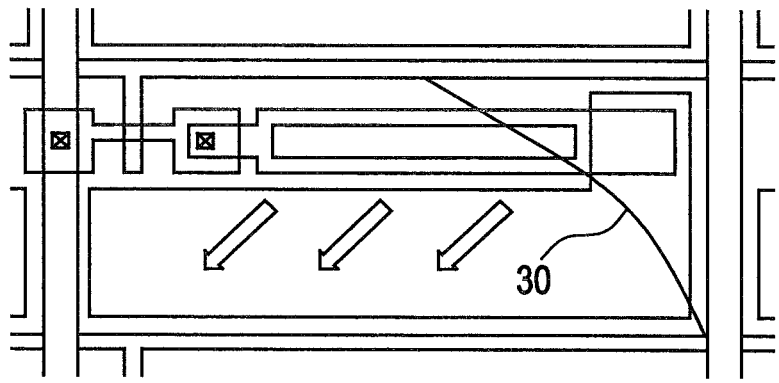
FIG. 5 shows how disclination occurs.

FIG. 5 shows a pixel having the same circuit layout as the pixel according to the first embodiment. As shown in FIG. 5, disclination is prone to occur in a top-right region 30 of the pixel in a display device in which a pixel electrode contact 31 is provided at a top-right position of the pixel, rubbing is performed in the top-right to bottom-left direction (not bottom-left to top-right direction), and the source-line-inverted driving is performed. (The source-line-inverted driving is a driving method in which signals of opposite polarities are applied to adjacent source lines, and includes the dot-inverted driving). Since the region 30 is not suitable for use for display, it is desired to cover it with a black matrix.

In view of the above, in this embodiment, a metal wiring 19 is provided in a right-hand region of the pixel as shown in FIG. 4A rather than in the top portion as in the case of the first embodiment.

Further, an opening 22 is formed in the metal wiring 19 and is covered with a black matrix 23. It is effective to form a contact for a pixel electrode in a bottom-right region 31 as shown in FIG. 4B.

In this manner, the auxiliary capacitor is formed in the region where disclination is prone to occur. In this embodiment, the auxiliary capacitor that is provided in the top portion of the pixel in the circuit of the first embodiment is moved to the right-hand region and hence the area of the opening remains the same in terms of the circuit designing. However, the effective opening area can be increased by overlapping the disclination and the auxiliary capacitor (or BM) with each other.

Embodiment 3

Figure 6A:
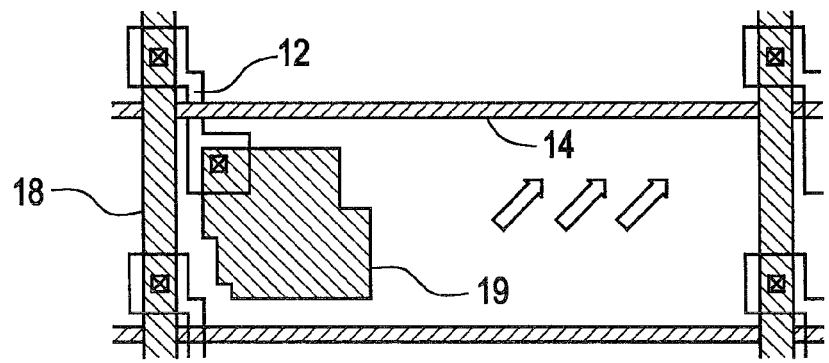
FIGS. 6A and 6B are top views showing a manufacturing process of an active matrix circuit according to a third embodiment of the invention.
Figure 6B:
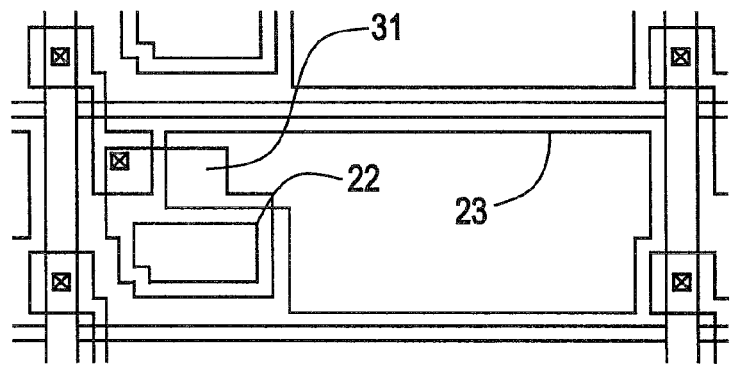

FIGS. 6A and 6B are top views showing a manufacturing processing according to this embodiment. The manufacturing process itself of this embodiment is almost the same as that of the first embodiment. The reference numerals commonly used in the first and third embodiments represent the same or equivalent parts. Although the layout relating to the auxiliary capacitor in this embodiment is substantially the same as in the second embodiment, in this embodiment it is intended to utilize the available area of each pixel more efficiently by changing the layout relating to the active layer of the thin-film transistor.

In this embodiment, rubbing is performed in the bottom-left to top-right direction, in which case disclination is prone to occur in a bottom-left region. While in the second embodiment the auxiliary capacitor is provided in such a region where disclination is prone to occur, in this embodiment part of the active layer of the thin-film transistor of the next row is additionally formed in this region. That is, as shown in FIG. 6A, a metal wiring 19 is provided in a left-hand region of the pixel and an active layer 12 is formed so as to cross a gate line 14 that is straightened (i.e., the branch portion of the gate line is removed).

Further, an opening 22 is formed in a metal wiring 19 and is covered with a black matrix 23 (see FIG. 6B).

In this manner, the auxiliary capacitor and part of the thin-film transistor are formed in the region where disclination is prone to occur. According to this embodiment, the available area of each pixel can be utilized more efficiently by a degree corresponding to the removal of the branch portion of the gate line.

Embodiment 4

Figure 7A:
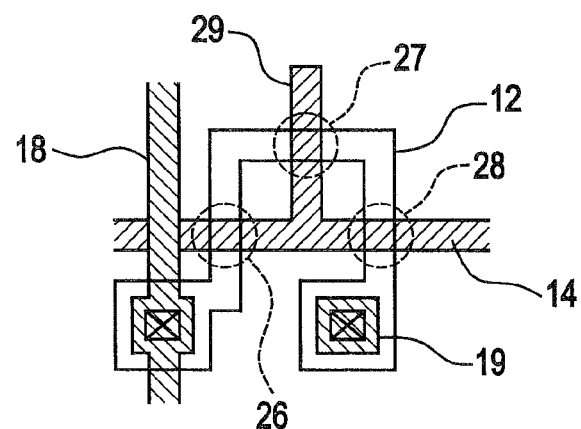
FIGS. 7A and 7B are a schematic top view and a circuit diagram of a thin-film transistor according to fourth embodiment of the invention.
Figure 7B:
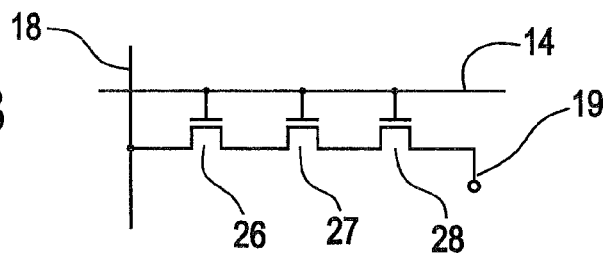
Figure 8A:
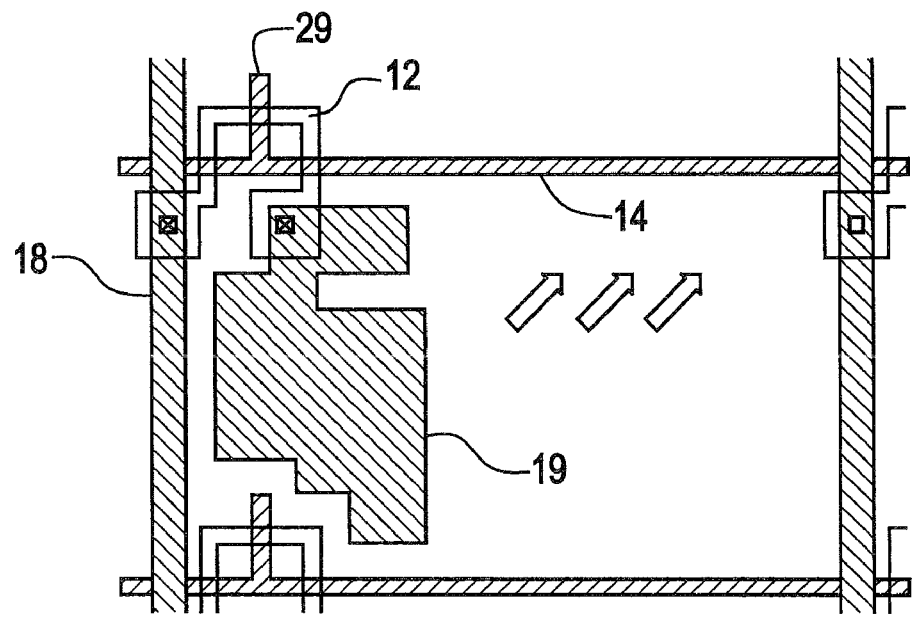
FIGS. 8A and 8B are top views showing a manufacturing process of an active matrix circuit according to the fourth embodiment.
Figure 8B:
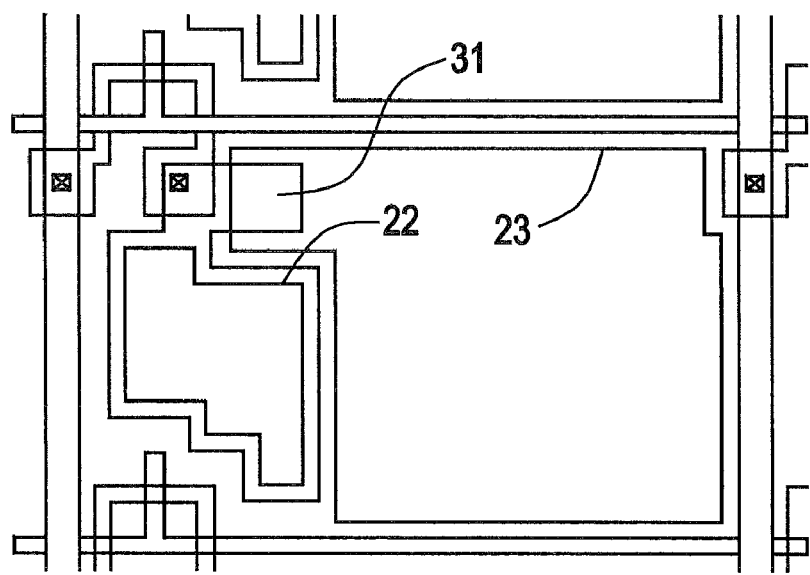

FIGS. 7A and 7B are a top view and a circuit diagram of a thin-film transistor according to this embodiment, and FIGS. 8A and 8B are top views showing a manufacturing process according to this embodiment. The manufacturing process itself of this embodiment is almost the same as that of the first embodiment. The reference numerals commonly used in the first and fourth embodiments represent the same or equivalent parts, and the reference numerals used in FIGS. 7A-7B and 8A-8B correspond to each other. Although the layout relating to the auxiliary capacitor in this embodiment is substantially the same as in the second embodiment, in this embodiment it is intended to utilize the available area of each pixel more efficiently by improving the characteristics of the thin-film transistor by changing the layout relating to the active layer of the thin-film transistor and the gate electrode.

In this embodiment, rubbing is performed in the bottom-left to top-right direction as in the case of the third embodiment and hence disclination is prone to occur in a bottom-left region. While in the second embodiment the auxiliary capacitor is provided in such a region and in the third embodiment the auxiliary capacitor and part of the active layer of a single-gate thin-film transistor are formed in this region, in this embodiment the active layer of a triple-gate thin-film transistor and the gate electrode are provided in this region as well as the auxiliary capacitor.

First, a triple-gate thin-film transistor used in this embodiment will be outlined with reference to FIG. 7A. This thin-film transistor is configured in such a manner that a gate line 14 is formed with a branch portion 29 and an active layer 12 overlaps with the gate line 14 and its branch portion 29 as shown in FIG. 7A. Transistors are formed at respective overlap portions 26-28.

That is as shown in FIG. 7B, three thin-film transistors are formed in series between a source line 18 and a metal wiring 19.

It is known that it is particularly effective to use this type of multiple transistor as a switching transistor of an active matrix (refer to Japanese Examined Patent Publication No. Hei. 5-44195).

Although the thin-film transistor having the above structure occupies a bottom-left region of the pixel of the next row, this does not reduce the aperture ratio as in the case of the second and third embodiments because this region is a region where disclination is prone to occur. That is, as shown in FIG. 8A, the gate line 14 is provided with the branch portion 29 and the active layer 12 is formed so as to cross the gate line 14 and its branch portion 29 three times in total. Further, a metal wiring 19 is formed in a left-hand region of the pixel as shown in FIG. 8A.

Further, an opening 22 is formed in the metal wiring 29 and is covered with a black matrix 23 (see FIG. 8B).

In this manner, the auxiliary capacitor and part of the thin-film transistor are formed in the region where disclination is prone to occur. This embodiment is disadvantageous as compared to the third embodiment in that the gate line needs the branch portion as in the case of the circuit of the second embodiment, by virtue of the use of the triple-gate thin-film transistor the auxiliary capacitance may be far smaller than in the third embodiment. Therefore, on balance, this embodiment is superior to the third embodiment in terms of characteristics.

Embodiment 5

FIGS. 9A-9B and FIGS. 11A-11D are top views and sectional views, respectively, showing a manufacturing process according to this embodiment. The reference numerals used in FIGS. 9A-9B and FIGS. 11A-11D correspond to each other, and the reference numerals commonly used in this embodiment and the above embodiments represent the same or equivalent parts. The layout relating to the auxiliary capacitor in this embodiment is different from that in the pixel circuit having the laminate structure of the first embodiment.

As in the case of the first embodiment, a 500-Å-thick amorphous silicon film is formed, by plasma CVD or low-pressure CVD, on a glass substrate 11 on which a proper underlayer film is formed. Then, an active layer 12 of a thin-film transistor is obtained by converting the amorphous silicon film into a crystalline silicon film by a known annealing technique and etching the crystalline silicon film.

Then, a 1,000-Å-thick silicon oxide film 13 is formed as a gate insulating film. A gate line (gate electrode) 14 is then obtained by forming a 5,000-Å-thick polysilicon film containing phosphorus by low-pressure CVD and etching it (see FIG. 11A).

Subsequently, a source 15 and a drain 16 are formed by implanting, into the active layer 12, ions of phosphorus that is an impurity for imparting n-type conductivity at a dose of $5 \times 10^{14}$ to $5 \times 10^{15}$ atoms/cm$^2$. Annealing is performed after the implantation of impurity ions.

Thereafter, a 2-μm-thick silicon oxide interlayer insulating film 17 is formed by a known insulating layer forming technique, and its surface is planarized by a known planarization technique (for instance, chemical mechanical polishing (CMP)). Then, contact holes reaching the source 15 and the drain 16 are formed by etching the interlayer insulating film 17 and the gate insulating film 13. Then, a source line 18 and a metal wiring (auxiliary capacitor electrode) 19 are formed by a known metal wiring forming technique. At this time, the metal wiring 19 is formed so as to cover the gate line 14 (see FIG. 11B).

Figure 9A:
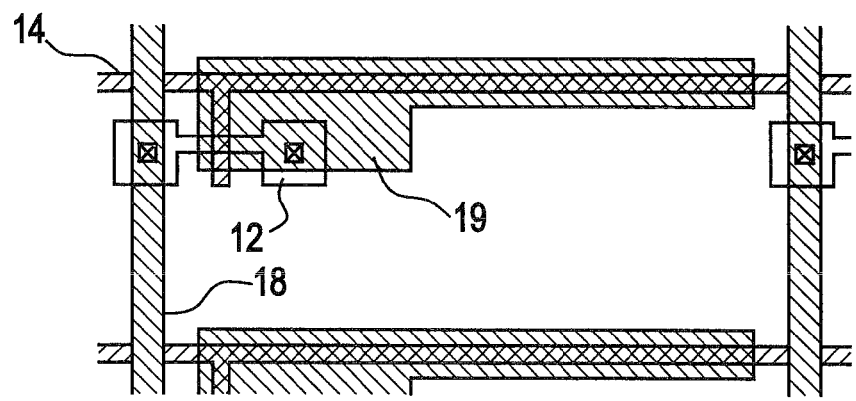
FIGS. 9A and 9B are top views showing a manufacturing process of an active matrix circuit according to a fifth embodiment of the invention.

FIG. 9A is a top view showing a circuit that has been formed by the above steps. This embodiment has a feature that the metal wiring 19 to serve as an electrode of the auxiliary capacitor partially covers the gate line 14. Being light-interruptive, both of the gate line 14 and the metal wiring 19 are factors of reducing the area of the pixel region that is usable for display. In the first embodiment, they are arranged so as not to overlap with each other and hence the area of the pixel region that is usable for display is reduced accordingly. This embodiment enables a larger area of the pixel to be used for display because of the structure that the gate line 14 and the metal wiring 19 overlap with each other.

Where the gate line 14 for driving the pixel electrode concerned and the metal wiring 19 that is connected to the pixel electrode overlap with each other as shown in FIG. 9A, it is preferable to weaken the capacitance coupling between the gate line 14 and the metal wiring 19. In this embodiment, this is done by making the interlayer insulating film 17 sufficiently thick. Alternatively, the metal wiring 19 may be over-lapped with the gate line 14 of the next row.

Thereafter, a silicon nitride film 20 is formed at a thickness of 250-1,000 Å (in this embodiment, 500 Å). A 200-Å-thick silicon oxide film (not shown) is then deposited. Subsequently, a polyimide layer 21 is formed by spin coating at a thickness of at least 8,000 Å or more, preferably 1.5 μm. The surface of the polyimide layer 21 is planarized. An interlayer insulating film consisting of the silicon nitride layer 20 and the polyimide layer 21 is thus formed. Then, an opening 22 for an auxiliary capacitor is formed by etching the polyimide layer 21 (see FIG. 11C).

Then, a 1,000-Å-thick titanium film is formed by sputtering. A black matrix 23 is formed so as to cover the opening 22 for an auxiliary capacitor by etching the titanium film.

Figure 9B:
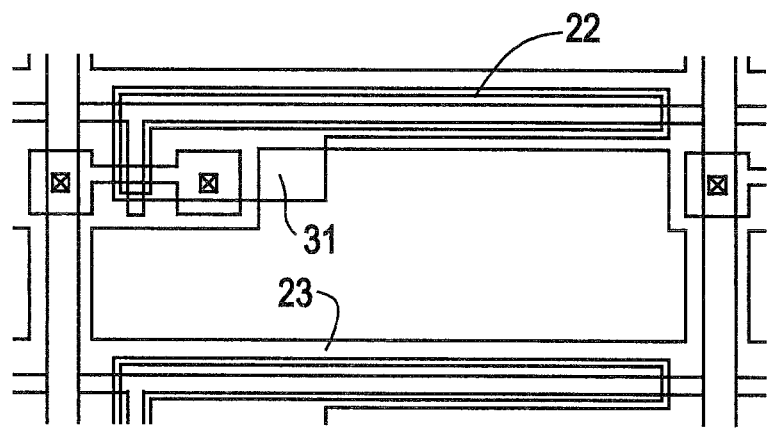
Figure 10:
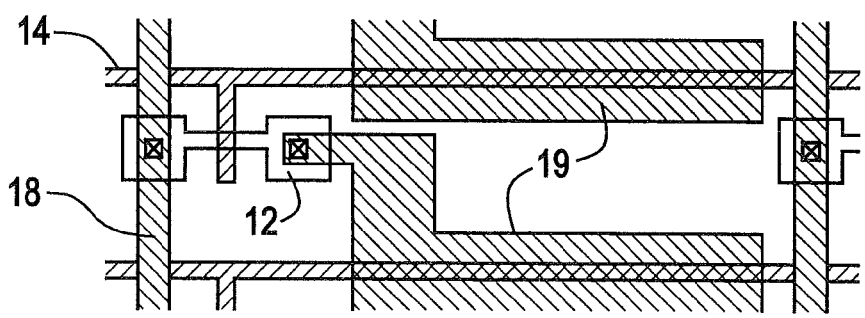
FIG. 10 is a top view of an active matrix circuit according to a modification of the fifth embodiment.
Figure 11A:
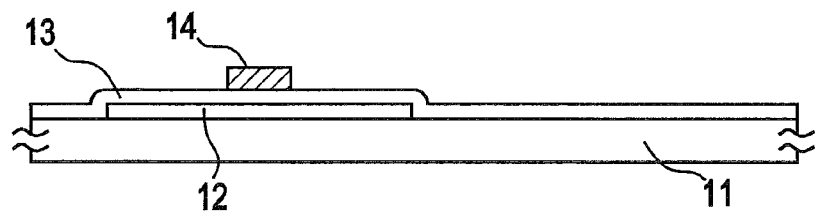
FIGS. 11A-11D are sectional views showing a manufacturing process of the active matrix circuit according to the fifth embodiment.
Figure 11B:
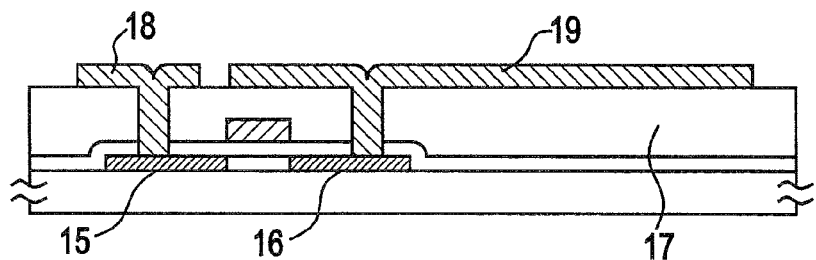
Figure 11C:
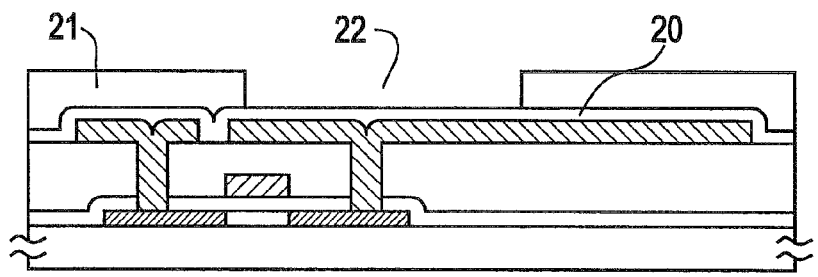
Figure 11D:
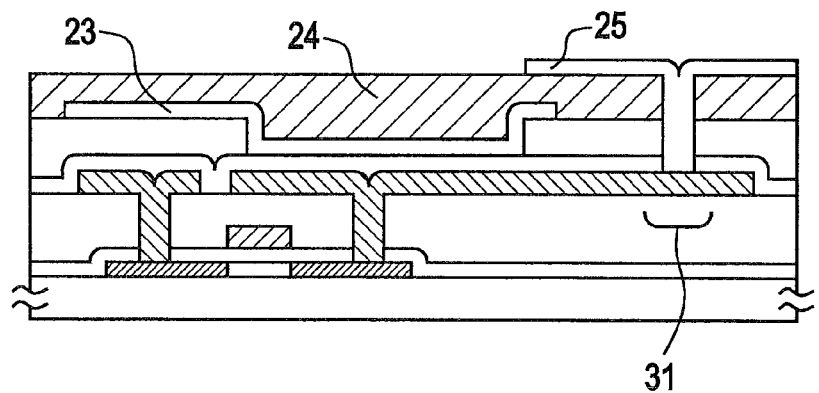

FIG. 9B is a top view showing the opening 22 for an auxiliary capacitor and the black matrix 23 that have been formed by the above steps. An auxiliary capacitor is formed in the region where the opening 22 and the black matrix 23 overlap. To increase the area of the opening portion, it is preferable to form the opening 22 for an auxiliary capacitor so as to overlap with the gate line 14. To form a contact hole for a pixel electrode, a region 31 where the metal wiring 19 and the black matrix 23 do not overlap is provided.

Then, after a 5,000-Å-thick polyimide film 24 is formed as an interlayer insulating film, a contact hole reaching the metal electrode 19 is formed by etching the portions of the polyimide films 21 and 24 in the region 31. A pixel electrode 25 is then formed by forming a 1,000-Å-thick ITO (indium tin oxide) film by sputtering and etching it (see FIG. 11D).

An active matrix circuit is thus completed. Although this embodiment is directed to the case of using the single-gate TFT, a similar pixel circuit may be obtained by using a multi-gate TFT, in which case the same advantages are obtained.

Embodiment 6

Figure 12:
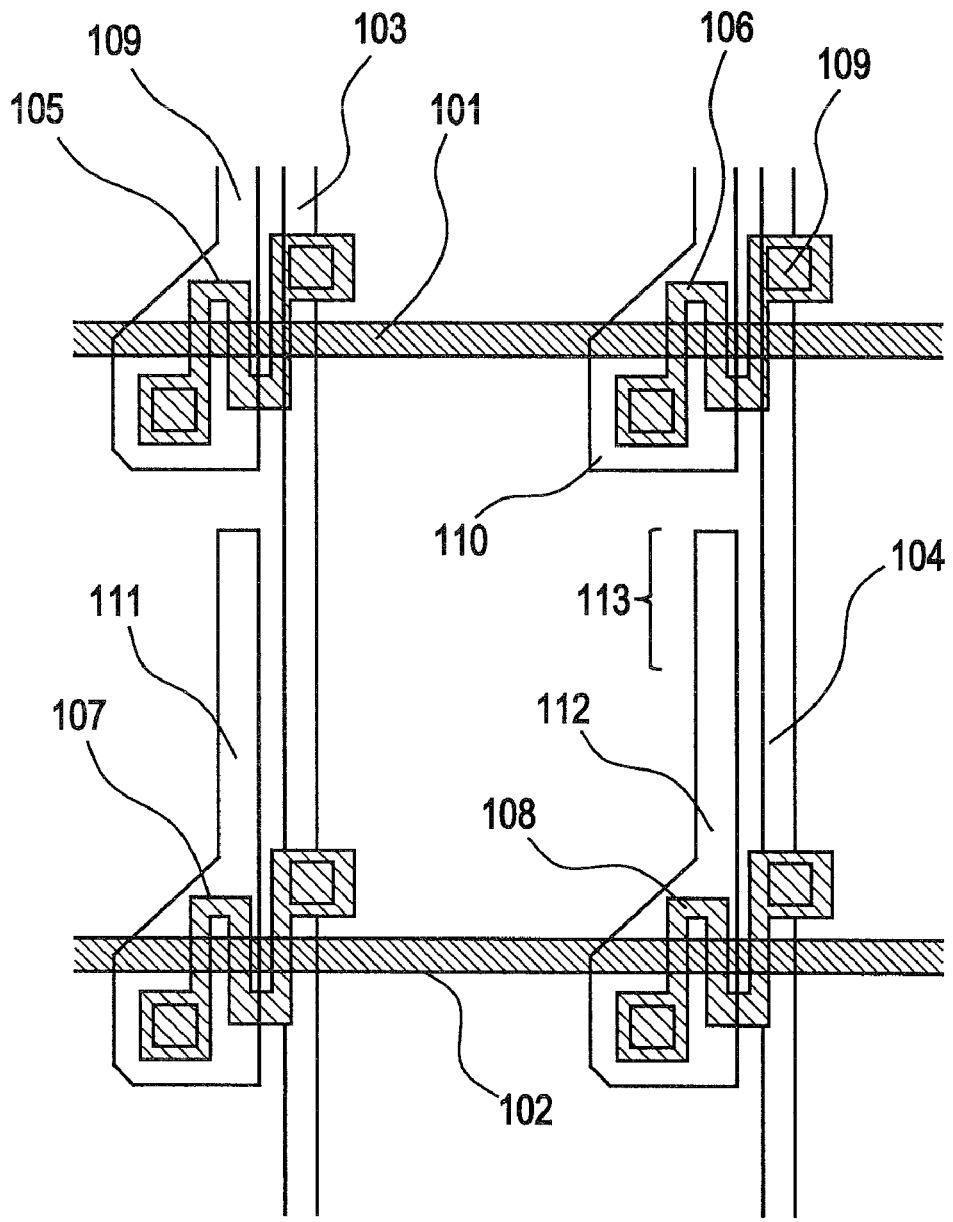
FIGS. 12-14 are top views showing the configuration of an active matrix circuit according to a sixth embodiment of the invention.

This embodiment will be described below with reference to FIGS. 12-15. FIG. 12 shows active layers 105-108 that are formed in the lowest layer, i.e., on a glass substrate, a quartz substrate, or some other insulating surface.

A gate insulating film (not shown) is formed on the active is layers 105-108. Gate lines 101 and 102 are formed on the gate insulating film.

The portions of each of the active layers 105-108 where the gate line 101 or 102 crosses the active layer become channel forming regions.

An interlayer insulating film (not shown) is formed on the gate lines 101 and 102, and source lines 103 and 104 are formed on the interlayer insulating film.

For example, the source line 104 is connected to the source region that is formed in the active layer 106 via a contact 109.

Drain electrodes 109-112 are formed by using the same material as the source lines 103 and 104 are done (i.e., by patterning the same film as the source lines 103 and 104 are done).

The drain electrodes 109-112 will be used to form capacitors and constitute parts of a black matrix.

An extension 113 of the drain electrode 112 is a pattern to increase the capacitance.

Each of the drain electrodes 109-112 is shaped so as to cover half or more of the active layer. With this structure, a desired auxiliary capacitance can be obtained without a large reduction in aperture ratio.

Figure 13:
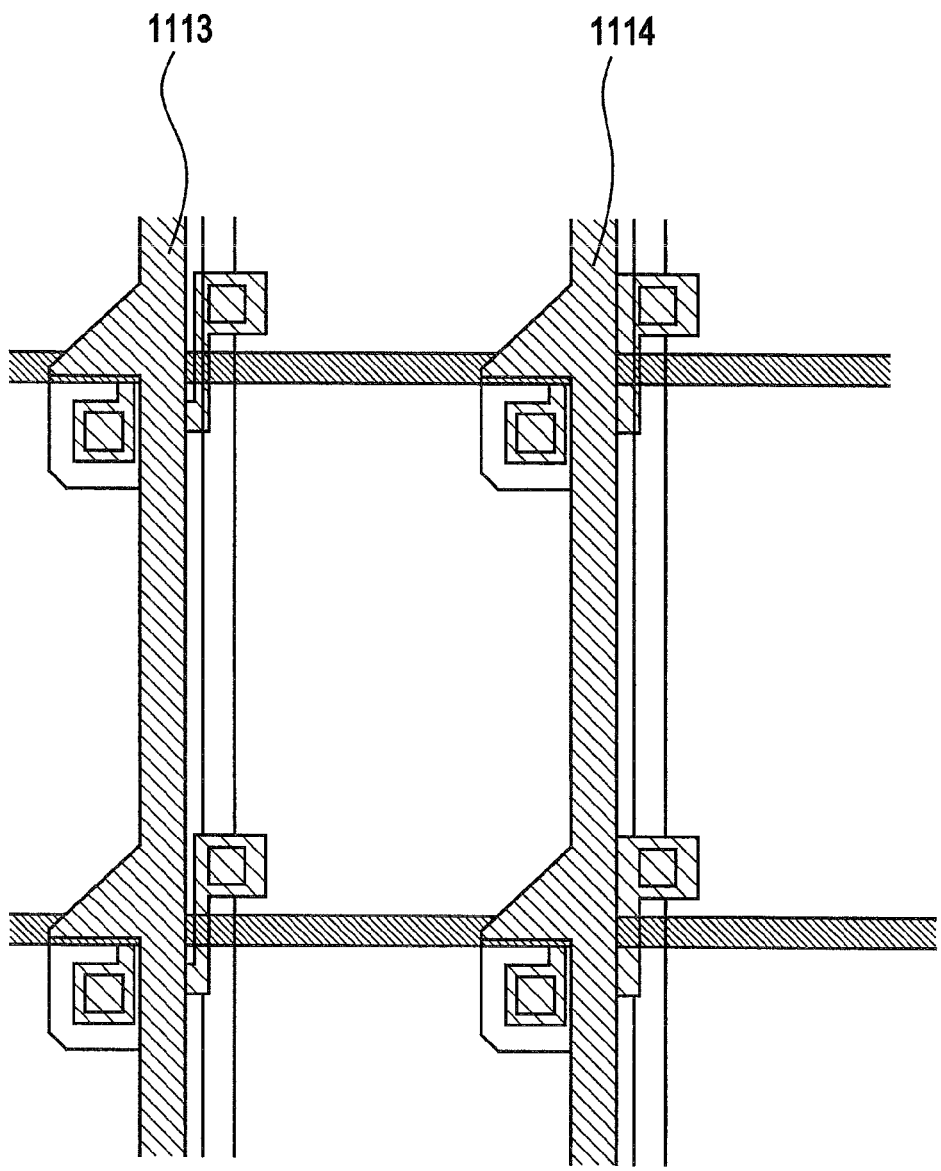

FIG. 13 shows a state that after the state of FIG. 12 a silicon nitride film (not shown) has been formed and capacitor lines 1113 and 1114 have been formed thereon. The silicon nitride film serves as a dielectric of each auxiliary capacitor.

Figure 14:
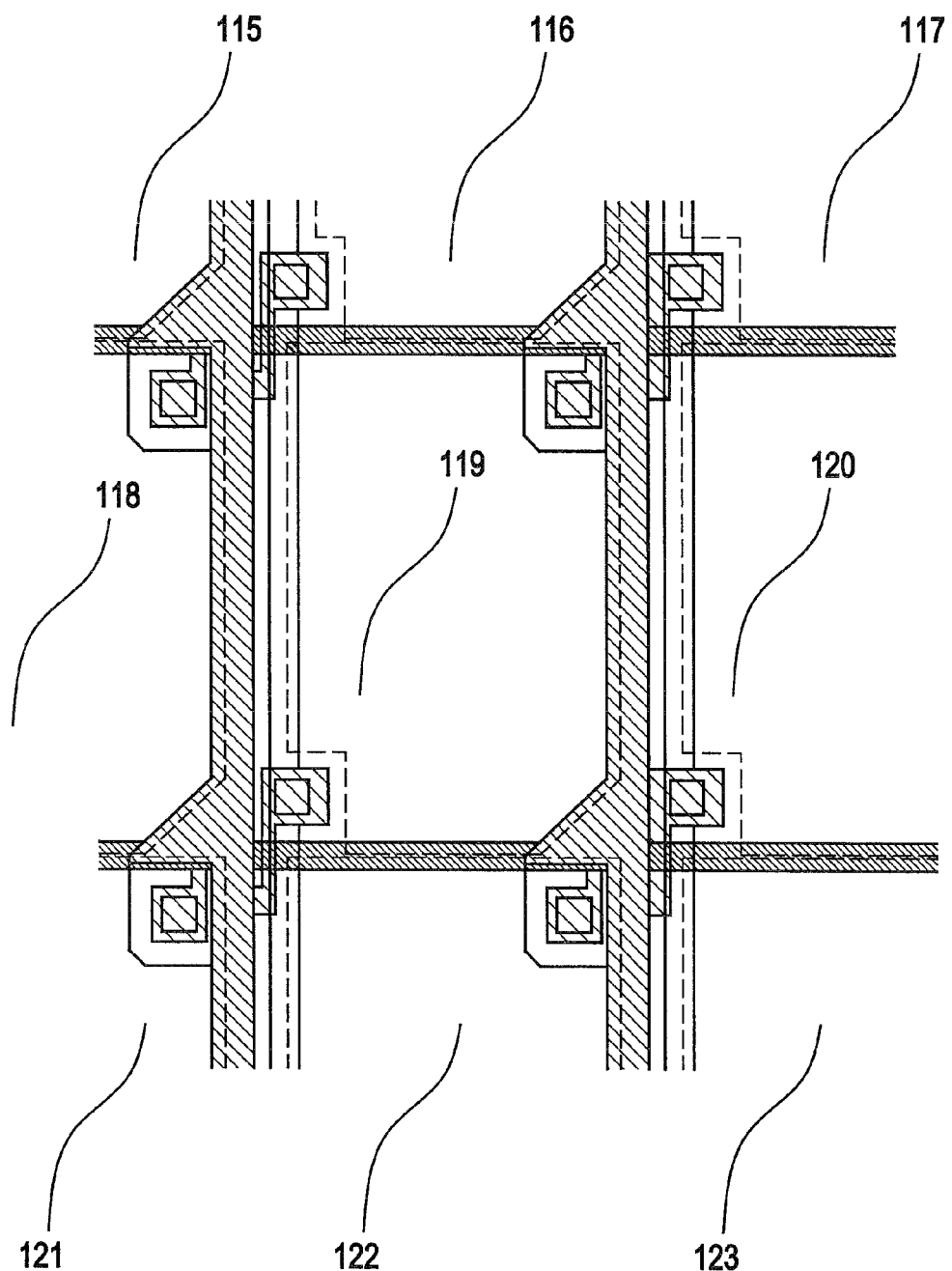

FIG. 14 shows a state that after the state of FIG. 13 an interlayer insulating film has been formed on the capacitor lines 1113 and 1114 and ITO pixel electrodes 115-123 have been formed on the interlayer insulating film.

In the configuration of this embodiment, the auxiliary capacitor is formed so as to cover the TFT and hence the aperture ratio of the pixel can be maximized.

Further, a large capacitance can be obtained by forming the capacitor between the capacitor line and the drain electrode that is formed between the drain region and the pixel electrode at the same time as the source line. This is because this configuration allows the dielectric film (in this embodiment, the silicon nitride film) that constitutes the auxiliary capacitor to be made thinner.

As described above, according to the invention, the conductive film used as a black matrix is used as an electrode and the auxiliary capacitor is formed between this conductive film and the metal wiring that is in the same layer as the source line.

With this configuration, the aperture ratio of the pixel can be increased because the top portion of the TFT is used to form a capacitor.

Although the embodiments are directed to the case of using the top-gate TFT, it is apparent that the invention can similarly be applied to the case of using the bottom-gate TFT because the invention is an improvement in the structure above the source line.

Having the above advantages, the invention is useful from the industrial viewpoint.

What is claimed is:

1. A semiconductor device comprising:
   a thin film transistor over a substrate and comprising a channel forming region, a source region and a drain region;
   a first insulating film over the thin film transistor;
   a source line over the first insulating film and electrically connected to the source region;
   a gate line over the substrate, the gate line comprising a portion which extends in a direction perpendicular to the source line;
   a drain electrode over the first insulating film and electrically connected to the drain region;
   a second insulating film over the drain electrode;
   a conductive film over the second insulating film, the conductive film extending in a direction parallel to the source line;
   a third insulating film over the conductive film;
   a pixel electrode over the third insulating film and electrically connected to the drain electrode; and
   a capacitor comprising the drain electrode, the second insulating film and the conductive film,
   wherein the conductive film comprises a first region and a second region,
   wherein a width of the first region of the conductive film is larger than a width of the second region of the conductive film, and
   wherein the first region of the conductive film overlaps with the channel forming region.

2. A semiconductor device comprising:
   a first layer over a substrate, the first layer comprising a first channel forming region and a first source region;
   a second layer over the substrate, the second layer comprising a second channel forming region and a second source region;
   a first gate line over the substrate, wherein the first gate line and the first channel forming region overlap with each other;
   a second gate line over the substrate, wherein the second gate line and the second channel forming region overlap with each other;
   a first insulating film over the first layer, the second layer, the first gate line and the second gate line;
   a source line over the first insulating film, the source line being electrically connected to the first source region and the second source region;
   a second insulating film over the source line; and
   a capacitor line over the second insulating film, the capacitor line overlapping with the first gate line, the second gate line, the first channel forming region and the second channel forming region.

3. The semiconductor device according to claim 2, wherein a capacitor comprises at least part of the capacitor line.

4. The semiconductor device according to claim 3, further comprising a drain electrode electrically connected to the first layer, wherein the capacitor further comprises at least part of the drain electrode.

5. The semiconductor device according to claim 2, further comprising a drain electrode electrically connected to the first layer,
wherein the drain electrode overlaps with the first channel forming region.

6. The semiconductor device according to claim 2, further comprising a gate insulating film between the first gate line and the first layer.

7. The semiconductor device according to claim 2, further comprising:
a gate insulating film on the first layer; and
a dielectric film over the gate insulating film,
wherein a capacitor comprises at least part of the dielectric film.

8. A semiconductor device comprising:
a first layer over a substrate, the first layer comprising a first channel forming region;
a second layer over the substrate, the second layer comprising a second channel forming region;
a first gate line over the substrate;
a second gate line over the substrate; and
a capacitor line crossing over the first gate line and the second gate line,
wherein the first channel forming region and the first gate line overlap with each other,
wherein the second channel forming region and the second gate line overlap with each other,
wherein the capacitor line overlaps with the first channel forming region, and
wherein the capacitor line overlaps with the second channel forming region.

9. The semiconductor device according to claim 8,
wherein a capacitor comprises at least part of the capacitor line.

10. The semiconductor device according to claim 9, further comprising a drain electrode electrically connected to the first layer,
wherein the capacitor further comprises at least part of the drain electrode.

11. The semiconductor device according to claim 8, further comprising a drain electrode electrically connected to the first layer,
wherein the drain electrode overlaps with the first channel forming region.

12. The semiconductor device according to claim 8, further comprising a gate insulating film between the first gate line and the first layer.

13. The semiconductor device according to claim 8, further comprising:
a gate insulating film on the first layer; and
a dielectric film over the gate insulating film,
wherein a capacitor comprises at least part of the dielectric film.

14. A semiconductor device comprising:
a first layer over a substrate, the first layer comprising a first channel forming region and a first source region;
a second layer over the substrate, the second layer comprising a second channel forming region and a second source region;
a first gate line over the substrate;
a second gate line over the substrate;
a source line over the substrate, the source line being electrically connected to the first source region and the second source region; and
a capacitor line over the substrate, the capacitor line extending in a direction parallel to the source line,
wherein the first channel forming region and the first gate line overlap with each other,
wherein the second channel forming region and the second gate line overlap with each other,
wherein the capacitor line comprises a first region, a second region and a third region between the first region and the second region,
wherein a width of the first region of the capacitor line is larger than a width of the third region of the capacitor line,
wherein a width of the second region of the capacitor line is larger than the width of the third region of the capacitor line,
wherein the first region of the capacitor line overlaps with the first channel forming region, and
wherein the second region of the capacitor line overlaps with the second channel forming region.

15. The semiconductor device according to claim 14,
wherein a capacitor comprises at least part of the capacitor line.

16. The semiconductor device according to claim 15, further comprising a drain electrode electrically connected to the first layer,
wherein the capacitor further comprises at least part of the drain electrode.

17. The semiconductor device according to claim 14, further comprising a drain electrode electrically connected to the first layer,
wherein the drain electrode overlaps with the first channel forming region.

18. The semiconductor device according to claim 14, further comprising a gate insulating film between the first gate line and the first layer.

19. The semiconductor device according to claim 14, further comprising:
a gate insulating film on the first layer; and
a dielectric film over the gate insulating film,
wherein a capacitor comprises at least part of the dielectric film.

* * * * *